(12) United States Patent
Roy et al.

(10) Patent No.: US 12,094,510 B2
(45) Date of Patent: Sep. 17, 2024

(54) MAGNETORESISTIVE RANDOM ACCESS MEMORY (MRAM) WITH END OF LIFE MARGIN SENSOR

(71) Applicant: NXP USA, Inc., Austin, TX (US)

(72) Inventors: Anirban Roy, Austin, TX (US); Thomas Stephen Harp, Austin, TX (US); Nihaar N. Mahatme, Austin, TX (US); Jon Scott Choy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 133 days.

(21) Appl. No.: 17/807,518

(22) Filed: Jun. 17, 2022

(65) Prior Publication Data

US 2023/0410870 A1 Dec. 21, 2023

(51) Int. Cl.
*G11C 11/16* (2006.01)
(52) U.S. Cl.
CPC ...... *G11C 11/1675* (2013.01); *G11C 11/1655* (2013.01); *G11C 11/1657* (2013.01); *G11C 11/1673* (2013.01); *G11C 11/1677* (2013.01)
(58) Field of Classification Search
CPC ............ G11C 11/1677; G11C 11/1673; G11C 11/1655; G11C 11/1675
USPC ....................................................... 365/171
See application file for complete search history.

(56) References Cited

U.S. PATENT DOCUMENTS

| 8,195,899 | B2 | 6/2012 | Chen et al. |
| 8,549,363 | B2 | 10/2013 | Cher et al. |
| 10,236,075 | B1* | 3/2019 | Kim .................. G11C 29/76 |
| 10,861,524 | B1 | 12/2020 | Roy et al. |
| 11,049,539 | B1 | 6/2021 | Sanjeevarao et al. |
| 2012/0241826 | A1* | 9/2012 | Satoh .................. H01L 29/7827 257/295 |
| 2013/0322162 | A1* | 12/2013 | Lee ..................... G11C 11/1675 365/158 |
| 2017/0263336 | A1 | 9/2017 | Nakayama et al. |
| 2019/0088301 | A1* | 3/2019 | Maekawa ............. G11C 11/005 |
| 2019/0206716 | A1* | 7/2019 | Kim ..................... H01L 29/7827 |
| 2020/0194048 | A1* | 6/2020 | Roy ...................... H10B 61/20 |
| 2023/0058423 | A1* | 2/2023 | Chevallier ......... G11C 13/0069 |

OTHER PUBLICATIONS

Goodman, et al.: "A Board-Level Prognostic Monitor for MOSTEF TDDB", Ridgetop Group Paper #RG101905, Version 2, Updated Oct. 24, 2005, 0-7803-9546-8/2006, IEEE, pp. 1-6.

(Continued)

*Primary Examiner* — Sung Il Cho (57) ABSTRACT

A magnetoresistive random access memory (MRAM) array includes a data array and a sensor array. Each MRAM cell includes a Magnetic Tunnel Junction (MTJ). Each MRAM cell of the data array stores a data bit. A first and second column of the sensor array are connected to form a sensor column which includes sensor cells, each formed by a first MRAM cell in the first column together with a second MRAM cell in the second column along a same word line. Only one of a first MTJ of the first MRAM cell or second MTJ of the second MRAM cell is used as an MTJ of the sensor cell, and drain electrodes of select transistors of the first and second MRAM cells are electrically connected. Read circuitry provides read data from the data array and a sensor output indicative of a rupture state of an MTJ of the sensor array.

20 Claims, 4 Drawing Sheets

(56) References Cited

OTHER PUBLICATIONS

Igarashi, et al.: "An On-die Digital Aging Monitor against HCI and xBTI in 16 nm Fin-FET Bulk CMOS Technology", 978-1-4673-7472-9/2015, IEEE, pp. 112-115.
Mlot: "Tesla Asked to Recall 158,000 Vehicles Over Flash Memory Failure", Jan. 14, 2021. website: https://www.pcmag.com/news/tesla-asked-to-recall-158000-vehicles-over-flash-memory-failure, Jun. 16, 2022 4:06:30 PM, pp. 1-4.
U.S. Appl. No. 17/249,906, Choy, et al.: "Memory With One-Time Programmable (OTP) Cells", filed Mar. 18, 2021.
U.S. Appl. No. 17/302,472, Williams, et al.: "Non-Volatile Memory Having Write Detect Circuitry", filed May 4, 2021.

\* cited by examiner

302 — RECEIVE A WRITE REQUEST WITH A CORRESPONDING ACCESS ADDRESS AND WRITE DATA

304 — DECODE THE ACCESS ADDRESS TO INDICATE A SELECTED ROW AND A SET OF SELECTED COLUMNS, IN WHICH THE SELECTED ROW AND THE SET OF SELECTED COLUMNS IDENTIFY A SET OF SELECTED BIT CELLS OF THE DATA ARRAY

306 — FOR A WRITE 0 PHASE OF THE WRITE OPERATION, ACTIVATE THE SELECTED WORD LINE AT A FIRST WORD LINE VOLTAGE, WLL, TO WRITE THE 0'S OF THE WRITE DATA TO A SUBSET OF THE SELECTED BIT CELLS AS INDICATED BY THE WRITE DATA AND TO WRITE 0'S TO THE ONE OR MORE SENSOR CELLS OF THE SENSOR ARRAY ALONG THE SELECTED WORD LINE, IN WHICH THE WRITE 0 IS PERFORMED BY PROVIDING CURRENT IN A FIRST DIRECTION THROUGH THE RESISTIVE ELEMENTS OF THE BITCELLS AND SENSOR CELLS BEING WRITTEN

308 — FOR A WRITE 1 PHASE OF THE WRITE OPERATION, ACTIVATE THE SELECTED WORD LINE AT A SECOND WORD LINE VOLTAGE, WLH, WHICH IS HIGHER THAN WLL, TO WRITE THE 1'S OF THE WRITE DATA TO THE REMAINING BIT CELLS OF THE SELECTED BIT CELLS AS INDICATED BY THE WRITE DATA AND TO WRITE 1'S TO THE ONE OR MORE SENSOR CELLS OF THE SENSOR ARRAY ALONG THE SELECTED WORD LINE, IN WHICH THE WRITE 1 IS PERFORMED BY PROVIDING CURRENT IN A SECOND DIRECTION THROUGH THE RESISTIVE ELEMENTS OF THE BITCELLS AND SENSOR CELLS BEING WRITTEN

MAGNETORESISTIVE RANDOM ACCESS MEMORY (MRAM) WITH END OF LIFE MARGIN SENSOR

BACKGROUND OF THE INVENTION

Field of the Invention

This invention relates in general to a Magnetoresistive Random Access Memory (MRAM) and more specifically to an MRAM with an end of life margin sensor.

Background

A Magnetoresistive Random Access Memory (MRAM) is a memory whose memory cells store information using magnetic states. With MRAM, nonvolatile data can be stored and cells can be written multiple times over the life of the memory. However, as the MRAM cycles, the magnetic tunnel junction (MTJ) of a weaker MRAM cell may rupture. These ruptures are typically corrected by error correction code (ECC), until the ECC budget is consumed. The MTJ of an MRAM cell, though, does not exhibit degradation with cycling, but instead experiences abrupt rupture of the dielectric inside the MTJ. For this reason, degradation of an MTJ cannot be detected in order to provide a warning of impending failure. Therefore, there is a need for an MRAM with an end-of-life margin sensor in order to provide early indication of possible impending failure of the MRAM due to too many ruptured MTJs.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an MRAM includes a data array (i.e. a main array) of MRAM cells that can be utilized as reprogrammable MRAM cells as well as a sensor array which can be utilized to provide an end of life warning indicator based on hard failures (MTJ ruptures) of the sensor array. The MRAM is arranged in rows (along word lines) and columns (along bit line/source line pairs), in which the intersection of each row (word line) and column (bit line/source line pair) has a corresponding MRAM cell having a select transistor and a magnetic tunnel junction (MTJ). The sensor array, as compared to the data array, is cycled with accelerated conditions (including voltage and time accelerations) to represent stress on the data array, and can therefore be used to provide the end of life warning indicator which indicates an impending MTJ rupture in the data array. The sensor array is located in-situ with the data array, but includes a lower current-resistance (IR) drop in the bit line (BL)/source line (SL) path in order to receive accelerated voltage stress over the MTJ. The bit cells in the sensor array are also selected more frequently during writes with respect to the data array in order to receive higher time acceleration. In one embodiment, the sensor array is implemented such that, in each row, multiple select transistors of multiple bit cells are hardwired in parallel to increase write current through the MTJ of one of the multiple bit cells of the row. The combination of the multiple bit cells which includes the MTJ which receives the write current can be referred to as a sensor bit cell. The remaining one or more MTJs of the other bit cells of the multiple bit cells are "removed" or deactivated from the row.

In the data array of the MRAM, each bit cell can be written to a high resistive state (HRS) or a low resistive state (LRS) depending on the direction of the write current through the MTJ of the bit cell, in which the HRS has a higher resistance than the LRS. In one embodiment, a selected bit cell is programmed to the LRS by applying a write voltage to the bit line and grounding the source line, resulting in a write current in a first direction through the MTJ of the selected bit cell. The selected cell is programmed to the HRS by applying a write voltage to the source line and grounding the bit line to result in a write current in an opposite direction through the MTJ of the selected cell. Therefore, in one embodiment, a write is performed in two parts or phases (a first part for writing 0s and a second part for writing 1s). In one embodiment, the HRS of a bit cell corresponds to a value of "1" and the LRS state to a value of "0". Alternatively, the HRS may correspond to the value of "0" and LRS to the value of "1". As will be seen in reference to the drawings below, in the data array, the write current is provided by only one select transistor, e.g. the select transistor of the selected bit cell. However, in the sensor array, the write current is provided by more than one select transistor connected in parallel.

To read the stored value of a selected bit cell in the data array, which has not experienced a hard fail (i.e. a rupture in the MTJ), the resistance of the MTJ of the selected bit cell is compared to a reference resistance, which falls between the LRS and the HRS. However, if a bit cell in the MRAM array has experienced a rupture, the MTJ of the damaged bit cell permanently remains at a very low permanent resistance (which is considerably lower than even the LRS). For example, a rupture of the MTJ refers to the destruction of the tunnel dielectric, creating a short across the tunnel dielectric, resulting in the very low permanent resistance. As the MRAM array cycles (i.e. performs writes), the weak bit cells rupture, and once they rupture, they are permanently at the very low resistance state, i.e. permanently damaged, in that they can no longer be written to either the HRS or LRS. Therefore, a bit cell whose MTJ is ruptured may be referred to as a ruptured bit cell, permanently ruptured cell, or damaged bit cell.

Figure 2:
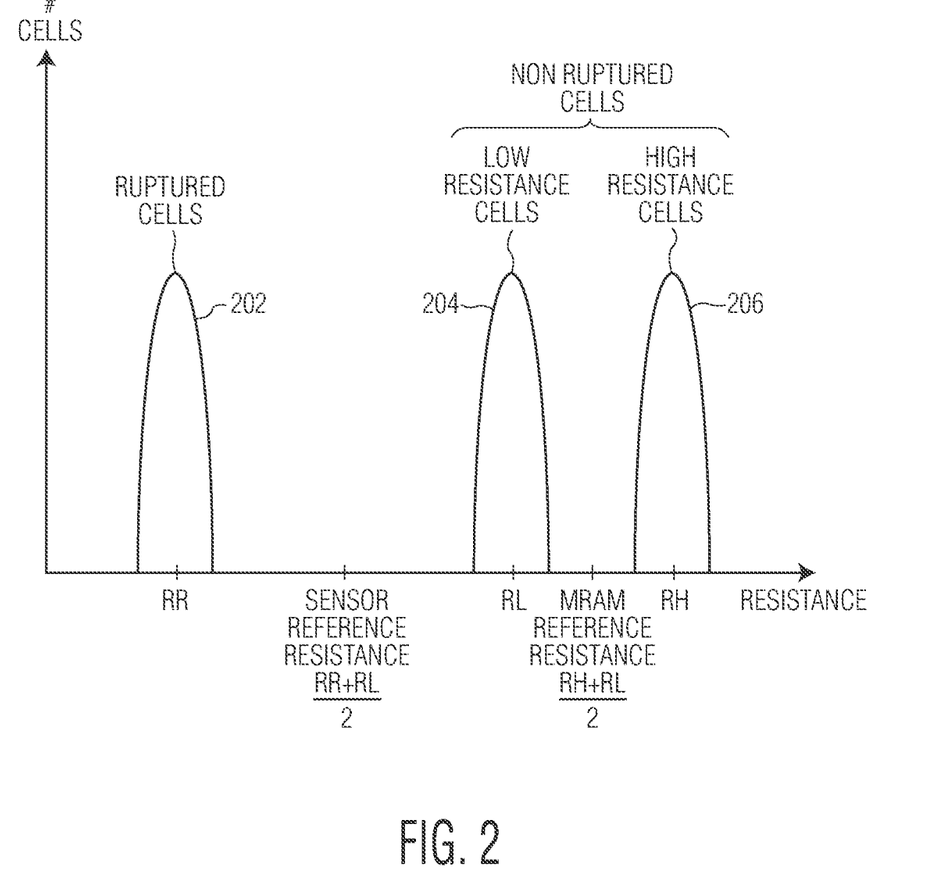
FIG. 2 is a graph showing a distribution of resistances of cells of an MRAM array according to one embodiment of the present invention.

FIG. 2 is a graph showing an example distribution of resistances of cells of a MRAM array. In FIG. 2, the resistance values are on the X axis and the number of cells having a particular resistance are on the Y axis. FIG. 2 shows the resistance distribution for cells of an MRAM array that are ruptured and those that are not ruptured. The cells that are not ruptured are either in the LRS or the HRS depending upon, for example, whether the magnetization direction of the free layer of its MTJ is in a parallel or anti-parallel direction with the magnetization of the fixed layer, as known in the art. As illustrated in FIG. 2, the ruptured cells have a resistance distribution 202 centered on the resistive value RR, which corresponds the median resistance value of the very low resistance of a ruptured MTJ. The LRS cells have a resistance distribution 204 centered on resistance RL, and the HRS cells have a resistance distribution 206 centered on resistance RH. Note that RR<RL<RH. The MRAM reference resistance for a read of the data array for differentiating between a '0' value and a '1' value, is centered half way between RL and RH, corresponding to "(RH+RL)/2." The sensor reference resistance for differentiating between a ruptured cell and a non-ruptured cell is centered half way between RR and RL, corresponding to "(RR+RL)/2." Note that a non-ruptured bit cell can be in either the HRS or the LRS. As will be described further below, this sensor resistance reference can be used by a product life predictor circuit coupled to the sensor array to provide a warning flag (e.g. an end of life warning indicator) for the MRAM.

Figure 1:
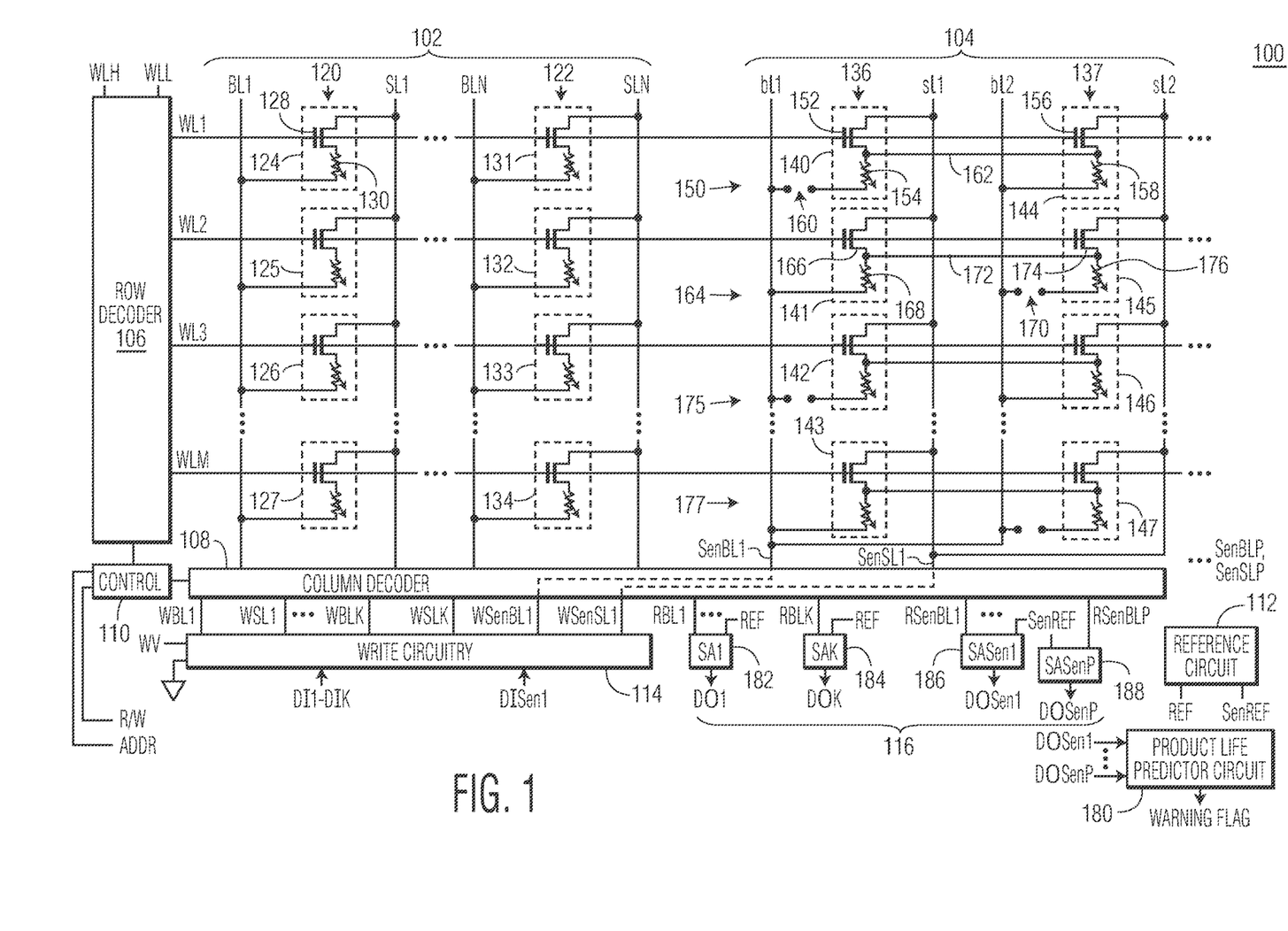
FIG. 1 is a diagram of an MRAM according to one embodiment of the present invention.

FIG. 1 is a diagram of an MRAM memory 100 according to one embodiment of the present invention. Memory 100 includes an array of MRAM cells 124-127, 131-134, 140-143, and 144-147 which is separated into two portions: data array 102 of regular MRAM cells (e.g. 124-127 and 131-134) and sensor array 104 of sensor cells (e.g. 150, 164, 175, and 177). The regular MRAM cells (also referred to as bit cells or regular bit cells) of data array 102 are located in M rows and N columns (including columns 120 and 122) for storing data, in which each of M and N can be any positive integer greater than one. Each of the M rows corresponds to a word line of data array 102 (WL1-WLM). Each of the N columns has a corresponding bit line, referred to as an array bit line (BL), and a corresponding source line, referred to as an array source line (SL). For example, column 120 includes BL1/SL1 and column 122 includes BLN/SLN. As will be described in reference to column decoder 108, the N columns of data array 102 are sectioned into K groups of J columns each, such that N=K×J. Therefore, for a read or a write, a K-bit data value is read from or written to K selected bit cells along a selected word line of data array 102, in which a set of K BL/SL pairs are selected from BL1/SL1-BLN/SLN.

Referring to FIG. 1, column 120 includes regular MRAM cells 124-127 and column 122 includes regular MRAM cells 131-134. In one embodiment, each cell (124) is characterized as an MRAM cell that includes an MTJ (130 for cell 124) and a select transistor (128 for cell 124) whose control terminal is coupled to a word line (WL1-WLM) that is asserted to access a specific row of memory cells for either reads or writes to the cells. The word lines (WL1-WLM) are provided by an address row decoder 106 and are selectively activated (i.e. asserted) based on a portion of a memory address of an access request received by control 110 on address lines (ADDR) from processing circuitry (not shown). Each word line corresponds to a row of array 102. Each regular MRAM cell (e.g. 124) of a column is connected to a corresponding array bit line of the column (e.g. BL1) and a corresponding array source line of the column (SL1). In the embodiment shown, in a regular MRAM cell (e.g. 124), the source of the select transistor (e.g. 128) is connected to the source line (e.g. SL1), the drain of the select transistor is connected to a first terminal of the MTJ (e.g. 130), and a second terminal of the select transistor is connected to the bit line (e.g. BL1).

Memory 100 also includes a sensor array 104 connected to data array 102, in which sensor array 104 shares the same word lines, WL1-WLM, with data array 102. Therefore, sensor array 104 is considered in-situ with data array 102. The MRAM cells of sensor array 104 (also referred to as bit cells or sensor bit cells) are located in M rows and Q columns (including columns 136 and 137), in which Q can also be any positive integer greater than one. Each of the Q columns has a corresponding column bit line (bl) and a corresponding column source line (sl). For example, column 136 includes bl1/sl1 and column 137 includes bl2/sl2. In the illustrated embodiment, only two columns of sensor array 104 are illustrated (columns 136 and 137), in which both columns together correspond to a single sensor column, as will be described in more detail below.

Column 136 includes sensor bit cells 140-143 and column 137 includes sensor bit cells 144-147. In the illustrated embodiment, each sensor bit cell (140) includes an MTJ (154 for cell 140, 158 for cell 144) and a select transistor (152 for cell 140, 156 for cell 144) whose control terminal is coupled to a word line (WL1-WLM) that is asserted to access a specific row of sensor cells. The word lines (WL1-WLM) are shared with data array 102 and so are provided by address row decoder 106 and are selectively activated (i.e. asserted) based on a portion of a memory address of an access request received by control 110 on address lines (ADDR) from processing circuitry (not shown).

Columns 136 and 137, together, form a sensor column having a corresponding sensor array bit line (SenBL1) and a corresponding sensor array source line (SenSL1).

Therefore, in the example with Q columns, pairs of the Q columns (such as columns 136/137) provide a total of P sensor columns including P sensor array bit lines/sensor array source lines (SenBL1/SenSL1-SenBLP/SenSLP), in which P=Q/2. A sensor cell (e.g. 150, 164, 175, and 175) is located at the intersection of each row (word line) and sensor column, in which each sensor cell is formed from two sensor bit cells in the sensor column along a same word line. In alternate embodiments, any number Y of the Q columns can be connected together to form the P sensor columns (in which P=Q/Y), and each sensor cell is therefore formed from Y sensor bit cells. In the illustrated embodiment, Y=2. Within connected columns of the sensor array, multiple select transistors of the connected columns, located along a same word line, are "drain connected", and only one of the multiple MTJs of the connected columns is connected to a corresponding column bit line, while the remaining MTJs of the connected columns are disconnected from the corresponding column bit lines. Also, for connected columns, the sensor bit lines of the connected columns are all connected to provide a single sensor array bit line, and the sensor source lines of the connected columns are all connected to provide a single sensor array source line. For example, referring to connected columns 136 and 137, bl1 and bl2 are connected to form a sensor array bit line, SenBL1, and sl1 and sl2 are connected to form a sensor array source line, SenSL1.

As an example, referring to the row of WL1, bit cell 140 of column 136 and bit cell 144 of column 137 are "connected" to form sensor cell 150. In sensor cell 150, the drain electrode of select transistor 152 in bit cell 140 is electrically connected (via conductor 162) to the drain electrode of select transistor 156 in bit cell 144. Similarly, in the row of WL2, bit cell 141 of column 136 and bit cell 145 of column 137 are connected to form sensor cell 164, in which the drain electrode of select transistor 166 in bit cell 141 is electrically connected (via conductor 172) to the drain electrode of select transistor 174 in bit cell 145. Similar drain connections between adjacent bit cells are connected in each of rows WL3-WLM to form sensor cells (e.g. sensor cells 175, 177). As will be discussed further below, these electrical connections between the drains of the select transistors allow the select transistors of two bit cells in different columns of sensor array 104 to be connected in parallel with each other. For example, select transistors 140 and 144 are connected in parallel. The connected select transistors may be referred to herein as "drain-connected" select transistors. Note that these bit cell connections exist for connected pairs of columns of the Q columns in sensor array 104. In the case of connecting more than two columns (e.g. Y columns), the drains of all select transistors in a row within a group of connected columns are connected in a similar manner such that all of these select transistors are connected in parallel.

Still referring to sensor array 104 of FIG. 1, in addition to the hardwired electrical connections between pairs of select transistors in each row, an MTJ of only one of the pair of connected bit cells is connected to the corresponding bit line of its column to operate as an MTJ of a sensor cell. The MTJ of the other bit cell is "removed" from array 104 by disconnecting a terminal of that MTJ from the corresponding bit line of its column. For example, referring to sensor cell 150 in the row of WL1, select transistor 156 and MTJ 158 of bit cell 144 are connected to WL1, bl2, and sl2, similar to the connectivity in a regular MRAM cell, in which a control terminal of select transistor 156 is connected to WL1, a first terminal of MTJ 158 is connected to the drain of select transistor 156, and a second terminal of MTJ 158 is connected to bl2. However, for cell 140 in this row, select transistor 152 is connected to WL1, sl1, and the first terminal of MTJ 154, but the second terminal of MTJ 154 is not connected to its corresponding bit line bl1 (as illustrated by gap 160). In this manner, MTJ 154 of cell 140 is effectively removed from array 104. Therefore, between connected cells 140 and 144, only MTJ 158 of cell 144 operates as the MTJ of sensor cell 150 while cell 140 may be referred to as a removed cell (and MTJ 154 as a removed MTJ). The same is true for connected cells 141 and 145 in which MTJ 168 of cell 141 is connected to the drain of select transistor 166 and bl1, but MTJ 176 of cell 145 is not connected to its corresponding bit line bl2 (as illustrated by gap 170). Therefore, between connected cells 141 and 145, only MTJ 168 of cell 141 operates as the MTJ of sensor cell 164, while cell 145 is a removed cell (and MTJ 176 as a removed MTJ).

Referring to the row of WL3, the select transistor and MTJ of cell 146 are connected to bl2 and sl2 similar to a regular MRAM cell, in which a first terminal of the MTJ is connected to a drain of the select transistor and a second terminal of the MTJ 146 is connected to bl2. However, for cell 142 in this row, the select transistor of bit cell 142 is connected to WL3, sl1, and the first terminal of the MTJ, but the second terminal of the MTJ is not connected to its corresponding bit line bl1 (as illustrated by a gap). In this manner, the MTJ of cell 142 is effectively removed from array 104. Therefore, between connected cells 142 and 146, only the MTJ of cell 146 operates as the MTJ of sensor cell 175, while the MTJ of bit cell 142 is a removed cell. The same is true for connected cells 143 and 147 in which the MTJ of cell 143 is connected to the drain of the select transistor and bl1, but the MTJ of cell 147 is not connected to bl2 (as illustrated by the gap). Therefore, between connected cells 143 and 147, only the MTJ of bit cell 143 operates as the MTJ for sensor cell 177, while bit cell 147 is a removed cell.

In the illustrated embodiment, the removed cell (with the removed MTJ) in the row of WL1 is the left cell of the connected pair and in the row of WL2 is the right cell of each connected pair. Alternatively, different patterns may be used for the MTJ of the sensor cell and the removed cell of the two connected cells within a row of the sensor array. Also, in the illustrated embodiment, the plurality of columns in each row used for each sensor cell is two. However, in alternate embodiments, more than two columns can be used (e.g. Y columns). For example, in the row of WL1, cells in columns 136, 137, and a third column may be connected to form a sensor cell. In this scenario, there would be three bit cells in three different column of the row having a total of three select gates connected in parallel with each other. Any pattern may be used to remove two of the three MTJs such that only one MTJ remains connected and useable as the MTJ of the sensor cell (while the other two cells are removed cells). Also, note that in alternate embodiments, connected columns of the sensor array need not be immediately adjacent columns.

Although FIG. 1 shows that arrays 102/104 include M rows (corresponding to word lines WL1-WLM) and N+Q columns (including 120, 122, 136, and 137), other embodiments may include a different number of rows (M), a different number of data array columns (N), and a different number of sensor array columns (Q). Also, any grouping of the N columns may be used for column decoder 108. In one example, array 102 includes 512 columns (N=512) which are sectioned into 64 groups (K=64) of 8 bits (J=8). In some embodiments, the MTJs of the cells of data array 102 and sensor array 104 have the same structure. As used herein, MTJs having the same structure mean that the corresponding structures of the MTJs have the same physical dimensions and are made of the same materials within manufacturing tolerances. As used herein with respect to information stored in a memory, the term "data" also includes instructions or commands stored in a memory.

Memory 100 includes data write circuitry 114 for writing data to the regular bit cells of array 102 and to simultaneously cycle sensor cells of sensor array 104. A write operation is performed to array 102 in which received write data is written to a corresponding received write address. The write address addresses (i.e. selects) K bit cells in array 102 along a selected word line. The write data is provided as data input 1-data input K (DI1-DIK) to write circuitry 114. Column decoder 108, based on a portion of the write address, ADDR, received by control 110, couples the array bit lines of the K selected columns to write circuitry 114 as WBL1-WBLK and couples the array source lines of the K selected columns to write circuitry 114 as WSL1-WSLK. In the embodiment shown, data write circuitry 114 includes K bit line control circuits coupled to WBL1-WBLK for controlling the voltage of the array bit lines (BLs) of the K selected columns during a memory write operation of write data to the K selected cells of array 102. The data write circuitry also includes K source line control circuits coupled to WSL1-WSLK for controlling the voltage of the array source lines (SLs) of the K selected columns during the memory write operation to the K selected cells. Note that column decoder 108 can implement any decode ratio (e.g. N/K), depending on the design of data array 102 of MRAM 100. Note also that column decoder 108, in addition to a portion of ADDR for determining which columns are selected, also receives a read/write (R/W) signal (via control 110) which indicates a read or write operation.

Therefore, based on the values of DI1-DIK, the bit line and source line control circuits provide either the write voltage (WV) or ground to each of WBL1-WBLK and WSL1-WSLK, which are coupled to the array source lines and array bit lines of the K selected columns by column decoder 108. In this manner, write circuitry 114 drives write currents through the MTJs of the K selected bit cells in the appropriate directions to program the desired write value. (As mentioned above, each write operation can be performed in two parts in which a first part writes the 0s and the second part writes the 1s.) Note that during write operations, row decoder 106 activates the selected word line based on a second portion of ADDR by setting the selected word line to word line voltage that is greater than ground. For writing a '0' value to a regular MRAM cell, the selected word line can be set to a low word line voltage (WLL), and for writing a '1', the selected word line can be set to a high word line voltage (WLH), which is greater than WLL and may be greater than Vdd. Note that the writes to data array 102 may be performed as known in the art.

During each write operation of write data to the K selected bit cells of data array 102, sensor cells along the selected word line of sensor array 104 are also cycled. Therefore, any time a write is performed to a selected row of array 102, the sensor cells of sensor array 104 along the same selected row are also cycled. That is, with every write to a selected row of array 102, a current is driven through the MTJ of each sensor cells in the same selected row of sensor array 104. For example, when a write operation is performed to K selected bit cells of data array 102 along WL2, MTJ 168 of sensor cell 164 is also cycled. However, since multiple select transistors are connected in parallel within each sensor cell, a larger current (i.e. an increased current) is provided through MTJ 168 as compared to the write current provided through the MTJs of the K selected cells in data array 102. In this example, both select transistors 166 and 174, in parallel, provide a write current through MTJ 168. This results in an accelerated voltage over the MTJ of the sensor cell as compared to the voltage over the bit cells of data array 102 during the write operation.

In addition to the voltage acceleration due to each MTJ of the sensor cells in sensor array 104 being driven by two or more select transistors in parallel, the sensor cells in sensor array 104 achieve time acceleration as well. That is, they are selected to receive their "write" current more often than the MTJs in the same row of array 102 because these sensor array cells are selected more often. A sensor cell of array 104 is written any time the row of the sensor cell is selected for a write to array 102. That is, if any set of K bit cells is selected along a particular row of array 102, any sensor cells of array 104 on the same row are also written. This may result in more frequent writes to the sensor cells than normal bit cells on the same row in array 102. Furthermore, the writes to the normal bit cells are performed as two part writes, for writing one state and then the other state. For each of parts of this write, though, the sensor cells in the same row are also "written". For example, during the write 0's in data array 102, an increased write current (driven by the multiple select transistors) in the sensor array is provided through the MTJ of the sensor cell of sensor array 104 in the same row in a first direction. Subsequently, during the write 1's in data array 102, the increased write current is again provided through the MTJ of sensor cell in the same row, but in an opposite direction. Therefore, for each write to data array 102 along a selected row, the MTJs of the sensor array on the select row are cycled twice (written with 0 and 1).

Figure 3:
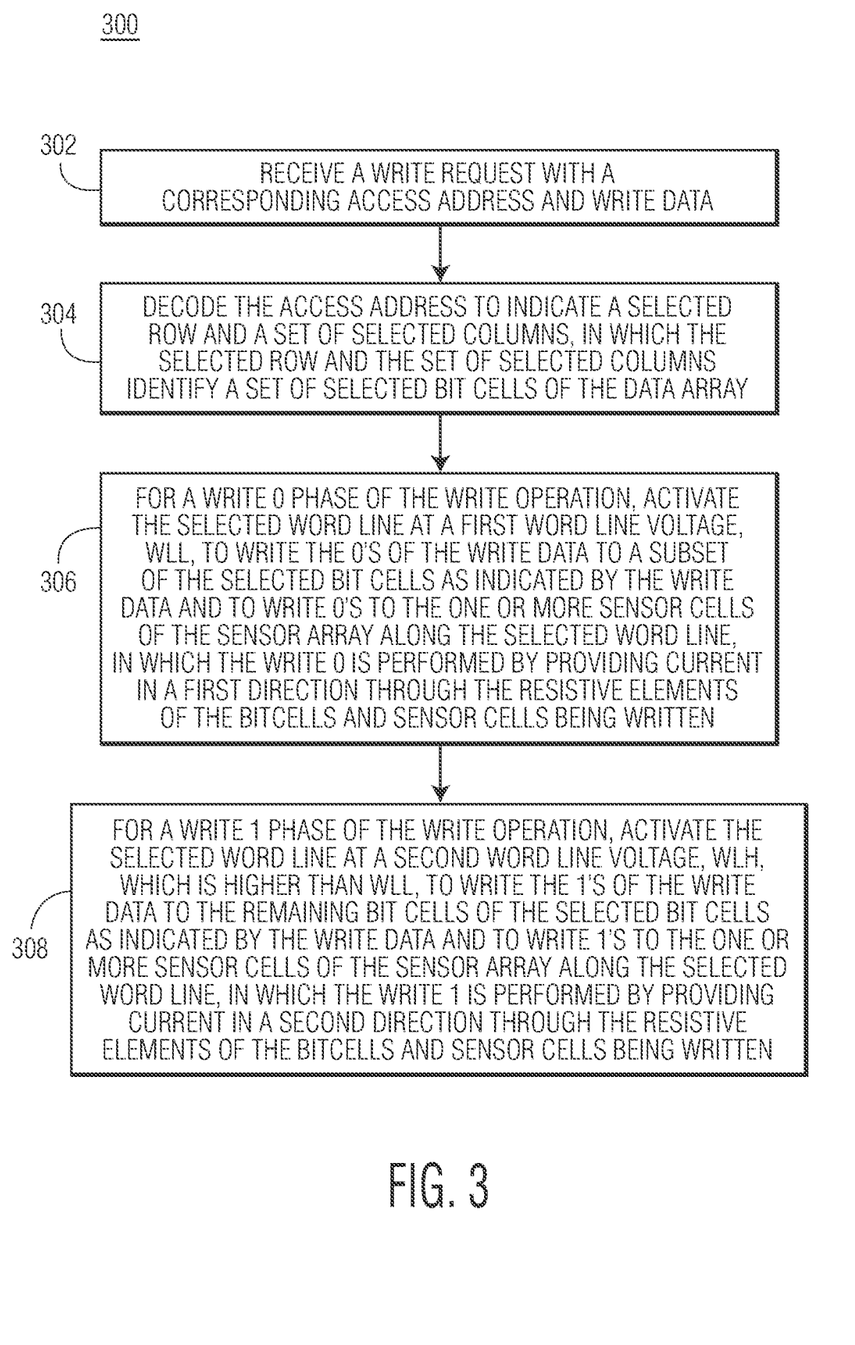
FIG. 3 illustrates, in flow diagram form, a method of performing a write operation in the MRAM of FIG. 1, in accordance with one embodiment of the present invention.

FIG. 3 illustrates, in flow diagram form, a method 300 for performing a write operation in MRAM 100, in accordance with one embodiment of the present invention. In block 302, a write request is received from a requesting device (e.g. a processor, direct memory access (DMA) controller, other master, etc.), in which the write request has a corresponding write access address and write data. Next, in block 304, the access address is decoded by row decoder 106 and column decoder 108 indicate a selected row and a set of selected columns, respectively. The selected row and set of selected columns identify a set of K selected bit cells of data array 102.

In the illustrated embodiment of FIG. 3, the two-part write operation begins with write 0's followed by write 1's, however, in alternate embodiment, this order may be reversed. In block 306, for the write 0 phase of the write operation, the selected word line is activated by applying WLL to the selected word line. The bit line drivers and source line drivers of write circuitry 114, for a subset of the K selected bit cells being written with a 0 (as indicated by the write data provided as DI1-DIK to write circuitry 114), apply the appropriate bit line and source line voltages to the corresponding selected columns to provide a write current in a first direction through the resistive elements of those bit cells being written (i.e. the subset of the K bit cells). In one embodiment, write circuitry 114 applies VBL to the bit lines and ground to the source lines of the corresponding selected columns for the subset of K selected bit cells to write 0s.

In block 308, for the write 1 phase of the write operation, the selected word line is activated by applying a higher word line voltage, WLH, to the selected word line. (In alternate embodiments, the same word line voltage may be used for both the write 0s and write 1s). The bit line drivers and source line drivers of write circuitry 114, for the remaining bit cells of the K selected bit cells being written with a 1 (as indicated by the write data provided as DI1-DIK), apply the appropriate bit line and source line voltages to the corresponding selected columns to provide a write current in a second direction, opposite the first direction, though the resistive elements of those being written (i.e. the remaining bit cells of the K bit cells). In one embodiment, write circuitry applies VBL to the source lines and ground to the bit lines of the corresponding selected columns for the remaining bit cells of the K selected bit cells to write 1s. Note that during a write 0, the select transistors act as a pulldown and hence can be effective at a gate voltage of WLL, however, during a write 1, the select transistor operates instead as a source follower, thus needing the higher gate voltage WLH. In one embodiment, WLH is higher than WLL by a few hundred mV.

As also indicated in block 306, during the write 0 phase, zeros are also written to the one or more sensor cells along the selected word line. A write of 0 to the one or more sensor cells refers to providing an increased write current driven by the group of parallel-connected select transistors corresponding to the sensor cell in a first direction through the MTJ of the sensor cell. Then, as also indicated in block 308, during the write 1 phase, ones are also written to the one or more sensor cells along the selected word line, in which a write of 1 refers to providing the increased write current driven by the group of parallel-connected select transistors corresponding to the sensor cell in the second direction through the MTJ. In this manner, the one or more sensor cells along the selected word line are exercised or cycled for each part of the write operation. That is, the MTJs of the one or more sense cells along the selected word line receive a current from the group of parallel-connected select transistors during both parts of the write operation.

In one embodiment, write circuitry 114 also includes a sensor bit line driver and a sensor source line driver for each of the P sensor columns, such that, during writes, the appropriate voltages are applied to the sensor bit lines and source lines to provide the write current in the correct direction. Furthermore, a sensor array data input, e.g. DISen1-DISenP, can be used to indicate the direction of this write current (i.e. corresponding to a write 0 or write 1). In the illustrated example of FIG. 1, it is assumed that there is only one sensor column, requiring only one sensor bit line driver and only one sensor source line driver in write circuitry 114, receiving DISen1 as an input. Also, since all sensor columns are selected along a selected word line during a write, SenBL1 can be directly connected as WSenBL1 and SenSL1 as WSenSL1 at write circuitry 114. (Alternatively, column decoder 108 can select a subset of the sensor columns of sensor array 102.)

Referring to FIG. 1, for the write 0 phase of the write operation, DISen1 can be set to zero, so that write circuitry 114 applies VBL to SenBL1 and ground to SenSL1. Assuming WL2 is the selected word line (e.g. active at WLL), this results in providing a write current in a first direction through MTJ 168, driven by parallel select transistor 166 and 174. Note that, as described above, MTJ 176 is not used, i.e. has been removed from array 104 with connection gap 170. For the write 1 phase of the write operation, DISen1 can be set to one, so that write circuitry 114 applies VBL to SenSL1 and ground to SenBL1. Continuing with the example of WL2 being the selected word line (e.g. active at WLH), this results in a write current in a second and opposite direction through MTJ 168, again driven by parallel select transistors 166 and 174.

Note that in alternate embodiments, separate sensor bit line and source line drivers can be used for writing 0s to the one or more sensor cells in the write 0 phase and writing 1s in the write 1 phase. Alternatively, different indications, other than DISen1, can be provided to write circuitry 114 to direct the writing of 0 then 1 (or vice versa) for the sensor cell's MTJ.

Memory 100 includes data read circuitry 116 for reading data stored in the cells of data array 102 and for reading sensor values from the sensor cells of sensor array 104. In the embodiment shown, read circuitry 106 includes K sense amplifiers (e.g. SA1 182-SAK 184), each for sensing the data value stored in a memory cell by comparing the resistance of the memory cell to a reference resistance (through signal REF). During a read operation, a sense amplifier (e.g. 182) is coupled to a bit line (e.g. BL1) of a selected column (e.g. 120) by column decoder 108 to compare a resistance of a selected cell (e.g. 124, when WL1 is selected) of that column to the reference resistance (through signal REF provided by a reference circuit 112). (Note that resistances can be compared by comparing, e.g., currents or voltages.) In this example, if the resistance of the selected cell is greater than REF (i.e. at the HRS), the output bit DO1 is provided as a 1, else the selected cell is at the LRS and DO1 is provided as 0. As illustrated in FIG. 2, REF for SA1-SAK corresponds to the normal MRAM reference resistance between the RL and RH resistances (for the LRS and HRS, respectively) for determining the stored logic state, i.e. for determining a stored zero value vs. a stored one value. The sense amplifiers SA1-SAK output the read data (DO1-DOK) to processing circuitry (not shown) on a data bus (not shown).

Read circuitry 116 also includes sense amplifiers (SASen1 186-SASenP 188) for use with sensor array 104, each for sensing a rupture state of a sensor cell (to indicate a ruptured state vs. non-ruptured state of the MTJ of the sensor cell) by comparing the resistance of the sensor cell to a sensor reference resistance (through signal SenREF), which is different from REF, as was described above in reference to FIG. 2. (Note that, as with SA1-SAK, resistances can be compared by comparing, e.g., currents or voltages.) In the example described herein, it is again assumed that there is only one sensor column, and thus only one sense amplifier for the sensor array, SASen1, is needed, which outputs DOSen1. For example, during a read operation, SASen1 is coupled to sensor bit line (e.g. SenBL1) of the sensor column of sensor array 108 (via column decoder 108) to compare a resistance of a selected sensor cell (e.g. 150, when WL1 is selected) to the sensor reference resistance (through signal SenREF provided by reference circuit 112). In this example, if the resistance of the selected sensor cell is less than SenREF, the output bit DOSen1 provides the rupture state as 0, which indicates that the selected sensor cell has ruptured and is therefore in the ruptured state. If the resistance of the selected cell is not less than SenREF, the output bit DOSen1 provides the rupture state as a 1, indicating that the selected sensor still is intact, i.e. has not yet ruptured and is therefore in the non-ruptured state.

As described above in reference to FIG. 2, the ruptured state is a permanent state in which the sensor cell cannot return to a non-ruptured state once it is in the ruptured state. Therefore, the ruptured state may also be referred to as the permanent ruptured state. Also, the MTJ of a sensor cell that is in a non-ruptured state can be in either the LRS or the HRS. However, it is not necessary to determine if the MTJ is in the LRS or the HRS because the sensor cell is used to simply indicate the ruptured vs non-ruptured state of the sensor cell. Since the value of DOSen1 indicates whether the selected sensor cell is in a ruptured or non-ruptured state, it may be referred to as a rupture indicator. In the above embodiment, DOSen1 is an active low signal in which a value of zero indicates the ruptured state while a value of one indicates the non-ruptured state. However, alternate embodiments can convert the DOSen1 indicator to an active high signal instead.

Note that in the illustrated embodiment of FIG. 1, SA1-SAK are each connected to a corresponding bit line of array 102 via column decoder 108, and SASen1-SASenP are each connected to a corresponding sense bit line of array 104. However, in alternate embodiments, SA1-SAK are instead connected to a corresponding source line of array 102 and SASen1-SASenP are each connected to a corresponding sense source line of array 102. That is, either the bit line or the source line can be used by each sense amplifier to sense a state of the corresponding cell.

Figure 4:
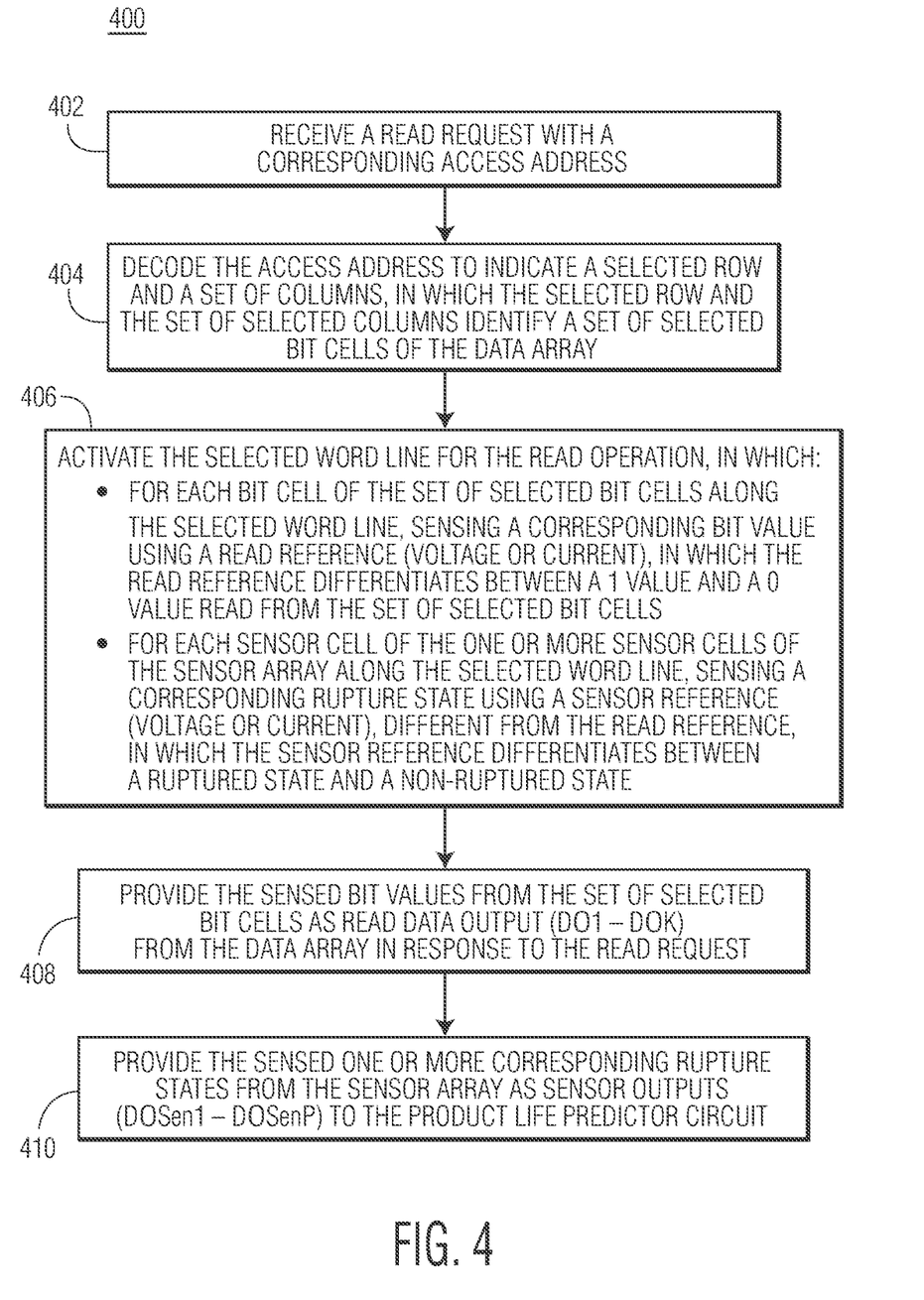
FIG. 4 illustrates, in flow diagram form, a method of performing a read operation in the MRAM of FIG. 1, in accordance with one embodiment of the present invention.

FIG. 4 illustrates, in flow diagram form, a method 400 for performing a read operation in MRAM 100, in accordance with one embodiment of the present invention. In block 402, a read request is received from a requesting device (e.g. a processor, direct memory access (DMA) controller, other master, etc.), in which the read request has a corresponding write access address and write data. Next, in block 404, the access address is decoded by row decoder 106 and column decoder 108 indicate a selected row and a set of selected columns, respectively. The selected row and set of selected columns identify a set of K selected bit cells of data array 102.

In block 406, the selected word line is activated by applying a word line voltage (e.g. WLL) to the selected word line. Sense amplifiers SA1-SAK sense the values of the corresponding bits of the read value using REF. As described above, REF is used to differentiate between a 1 value and a 0 value for each bit read from the K selected bit cells. Also, for each sensor cell of array 104 along the selected word line, SenSA1-SenSAP, senses a corresponding rupture state using SenREF, in which SenREF is used to differentiate between a ruptured state and a non-ruptured state.

In block 408, the sensed bit values are provided by SA1-SAK as read data output DO1-DOK from data array 102 in response to the read request. In block 410, the sensed rupture states from SenSA1-SenSAP are provided as sensor outputs DOSen1-DOSenP.

Note that in the illustrated embodiment of FIG. 4, when a read of selected bit cells along a selected word line from data array 102 is performed, the rupture states from the sensor cells of sensor array 104, along the same selected word line, are also simultaneously read (i.e. the sensed rupture states are also provided). However, in alternate embodiments, reads of array 104 can be performed in various ways and at various different times in order to obtain the rupture states from sensor cells along a selected word line. That is, obtaining the rupture states from sensor array 104 may or may not be performed simultaneously with reads from data array 102. In one example, rupture states may be sensed periodically, by selecting each word line serially, in turn, thus providing DOSen1-DOSenP each time.

Memory 100 also includes a product life predictor circuit 180 which receives DOSen1-DOSenP, and provides a warning flag in response to these inputs. For example, in block 410 of FIG. 4, the sensor outputs DPSen1-DOSenP are provided to product life predictor circuit 180. In the example with only one sensor column, product life predictor circuit receives DOSen1 and provides the warning flag in response to DOSen1. Since the MTJs of the sensor cells in sensor array 104 are receiving accelerated stress during cycling (e.g. during write operations) as compared to the MTJs of data array 102, they are expected, in general, to rupture (i.e. experience a hard failure) before the MTJs of the data array. The accelerated stress is achieved in terms of accelerated voltage over the MTJ or accelerated time for the MTJ, or both, as described above. By monitoring the sensor outputs from sensor array 104, product life predictor circuit 180 can forecast the remaining life of the memory based on the hard fails mechanism of the MTJs. Note that, in some embodiments, additional sensors can be added for fails in the word lines (such as broken word lines).

In one embodiment, to ensure that sensor array 104 fails prior to data array 102, the amount of stress acceleration should overcome the fact there are fewer MTJs in the sensor array as compared to the bit cells in the main array. That is, the data array is already at a disadvantage due to its larger sample size, therefore, a decision can be made how to design the sensor array to help ensure prior failure of the sensor array. In one embodiment, the number of connected columns of the sensor array to create a sensor column can be designed with increased numbers, as needed, to further accelerate ruptures for the MTJs.

In one embodiment, based on DOSen1-DOSenP, product life predictor circuit 180 asserts a warning flag which can be used to inform a customer of useful life remaining in the data array. In this manner, applications can balance data logging and activity versus reliability. Therefore, the warning flag is not an error detection flag which detects a failure of data array 102 but is instead an indication of an impending failure of data array 102 based on detected hard failures in sensor array 104. Based on the design of sensor array 104, the warning flag can be designed to alert for impending failures at a particular estimated time prior to failure of data array 102, as needed in a particular application.

Therefore, by now it can be understood how columns of an MRAM array can be used as a sensor array to provide sensor cells which experience accelerated cycling stress. The outputs of the sensor cells therefore provide an indication of failure in the sensor array which may correlate with impending failure of the data array (i.e. main array) of the MRAM. In one embodiment, multiple columns of the MRAM array are connected to form sensor cells, such that multiple select transistors of a sensor cell provide a write current through a corresponding MTJ of the resulting sensor cell. In this manner, an increased write current is achieved each time the sensor cells are cycled, as compared to writes to the data array. Also, in one embodiment, a sensor cell is cycled anytime a write is performed to a set of selected bit cells located along the same word line as the sensor cell. Further, the sensor cells can be cycled both during the write 0 and write 1 phases of a write operation, which helps further accelerate cycle stress. The output of the sensor cells can therefore be used to provide a warning flag indicating possible impending failure of the data array of the MRAM, thus indicating possible impending end of lifetime of the MRAM.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The following are some embodiments of the present invention.

In an embodiment, a magnetoresistive random access memory (MRAM) includes an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ). Each MRAM cell of the data array is configured to store a data bit, and, in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other. The MRAM includes read circuitry configured to provide a set of output bits as read data from a set of selected MRAM cells at a read address of the data array and configured to provide a sensor output indicative of a rupture state of an MTJ of a selected sensor cell of the sensor array; and a life predictor circuit configured to provide a warning indicating of impending failure of the data array based on the sensor output. In one aspect of the above embodiment, the rupture state of the MTJ of the selected sensor cell is selected from a group consisting of a permanently ruptured state and a non-ruptured state. In a further aspect, when the MTJ of the selected sensor cell is in the non-ruptured state, the sensor output has a first logic state and the MTJ of the selected sensor cell is capable of having a resistance state selected from a group consisting of a high resistance state (HRS) and a low resistance state (LRS), and when the MTJ of the selected sensor cell is in the permanently ruptured state, the sensor output has a second logic state and the MTJ of the selected sensor cell has a very low resistance that is lower than a resistance of each of the HRS and the LRS. In another aspect of the above embodiment, the read circuitry includes a first set of sense amplifiers configured to be coupled to columns of the data array and sense the set of output bits of the selected MRAM cells of the data array during a read operation on the data array, and a second set of sense amplifiers configured to be coupled to the sensor column and sense the rupture state of the MTJ of the selected sensor cell during a read operation on the sensor array. In a further aspect, the first set of sense amplifiers is configured to use a first reference which differentiates between a logic state of zero and a logic state of one, and the second set of sense amplifiers is configured to use a second reference, different from the first reference, which differentiates between a permanently ruptured state and a non-ruptured state. In yet a further aspect, the logic state of zero corresponds to a first resistance state, the logic state of one corresponds to a second resistance state, different from the first resistance state, the permanently ruptured state corresponds to a third resistance state that is lower in resistance than each of the first resistance state and the second resistance state, and the first reference corresponds to a resistance between the first and second resistance states, and the second reference corresponds to a resistance between the third resistance and a lowest resistance of the first and second resistance states. In another aspect of the above embodiment, the MRAM further includes write circuitry configured to, with each write operation to a set of selected MRAM cells at a corresponding write address in the data array along a corresponding selected word line, provide a write current through each MTJ of the set of selected MRAM cells and provide an increased write current through an MTJ of a selected sensor cell along the corresponding selected word line. In a further aspect, with each write operation, the increased write current is provided by both the first and the second select transistors of the first and second MRAM cells of the selected sensor cell along the corresponding selected word line. In yet a further aspect, each write operation includes a first write phase to write a first logic state to a subset of the set of selected MRAM cells at the corresponding write address in the data array and a second phase to write a second logic state to a remaining subset of the set of selected MRAM cells at the corresponding write address in the data array, wherein the increased write current is provided through the MTJ of the selected sensor cell along the corresponding selected word line is provided during both the first write phase and the second write phase. In yet an even further aspect, the write current and the increased write current are provided in a first direction through the MTJs of the subset of the set of selected MRAM cells and the MTJ of the selected sensor along the corresponding selected word line during the first write phase, and are provided in a second direction, opposite the first direction, through the MTJs of the remaining subset of the set of selected MRAM cells and the MTJ of the selected sensor along the corresponding selected word line during the second phase. In another aspect of the above embodiment, the corresponding bit line of the first column is connected to the corresponding bit line of the second column to form a first sensor bit line and the corresponding source column of the first column is connected to the corresponding source line of the second column to form a first sensor source line. In a further aspect, in each sensor cell: a source electrode of the first select transistor in the first MRAM cell is connected to a first source line corresponding to the first column, and a source electrode of the second select transistor in the second MRAM cell is connected to a second source line corresponding to the second column, a gate electrode of the first select transistor in the first MRAM cell and a gate electrode of the second select transistor in the second MRAM cell are connected to the same word line, and the only one of the first MTJ or the second MTJ is connected to the drain electrodes of the first and second select transistors and to a first bit line corresponding to the first column, and a second MTJ of the second MRAM cell is connected to the drain electrodes of the first and second select transistors but is not connected to a second bit line corresponding to the second column.

In another embodiment, an MRAM includes an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ). Each MRAM cell of the data array is configured to store a data bit, and, in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other; and write circuitry configured to, with each write operation to a set of selected MRAM cells at a corresponding write address in the data array along a corresponding selected word line, provide a write current through each MTJ of the set of selected MRAM cells at the corresponding write address and provide an increased write current through each MTJ of any sensor cell along the corresponding selected word line. In one aspect of the another embodiment, for each write operation, the write current though each MTJ of the set of selected MRAM cells at the corresponding write address is provided by a single select transistor in one MRAM cell, and the increased write current through each MTJ of any corresponding sensor cell is provided by multiple select transistors connected in parallel from multiple MRAM cells. In another aspect, the MRAM further includes read circuitry which includes a first set of sense amplifiers configured to be coupled to columns of the data array and sense a set of output bits from a set of selected MRAM cells at a read address of the data array using a first reference during a read operation on the data array, and a second set of sense amplifiers configured to be coupled to the sensor column and sense a rupture state of an MTJ of a selected sensor cell using a second reference, different from the first reference, during a read operation on the sensor array. In a further aspect, the first reference differentiates between a logic state of zero and a logic state of one stored in any selected MRAM cell of the data array, and the second reference differentiates between a permanently ruptured state and a non-ruptured state of any selected sensor cell of the sensor array.

In yet another embodiment, in an MRAM having a data array and a sensor array in which the MRAM array arranged in rows and columns, each row having a corresponding word line and each column having a corresponding bit line and a corresponding source line, and an intersection of each row and column has a corresponding MRAM cell, wherein each corresponding MRAM cell includes a select transistor and a Magnetic Tunnel Junction (MTJ), a method includes, in response to a write request having a corresponding write address and write data, wherein the write address addresses a set of selected MRAM cells in the data array, performing a write operation to write the write data to the set of selected MRAM cells in the data array; and, in response to the write request, providing a write current through an MTJ of any sensor cell in the sensor array along a same row as the set of selected MRAM cells, wherein each sensor sell includes multiple MRAM array cells along the same row with drain-connected select transistors in which only one MTJ of the multiple MRAM array cells operates as an MTJ of the sensor cell. In one aspect of the another embodiment, performing the write operation includes providing a first write current in a first direction to write a first logic state to a subset of the set of selected MRAM cells in the data array and simultaneously providing an increased first write current in the first direction through the MTJ of the any sensor cell in the sensor array along the same row, and providing a second write current in a second direction, opposite the first direction, to write a second logic state to a remaining subset of the set of selected MRAM cells at in the data array and simultaneously providing an increased second write current in the second direction through the MTJ of the any sensor cell in the sensor array along the same row. In a further aspect, each of the increased first and second write currents are provided by drain-connected select transistors in parallel of multiple MRAM array cells along the same row. In another aspect of the another embodiment, the method further includes, in response to a read request having a corresponding read address which addresses a set of selected MRAM cells at the read address in the data array, performing a read operation to obtain read data from the set of selected MRAM cells at the read address, using a using a first reference to differentiate between a first logic state and a second logic state of each bit of the read data, and providing a sensor output indicative of a rupture state of a selected sensor cell of the sensor array in response to sensing the selected sensor cell using a second reference, different from the first reference, to differentiate between a permanently ruptured state and a non-ruptured state of an MTJ of the selected sensor cell.

What is claimed is:

1. A magnetoresistive random access memory (MRAM) comprising:
    an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
        each MRAM cell of the data array is configured to store a data bit, and
        in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other wherein the drain electrode of the first select transistor of the first MRAM cell is located between a gate of the first select transistor and the first MTJ and the drain electrode of the second select transistor of the second MRAM cell is located between a gate of the second select transistor and the second MTJ;
    read circuitry configured to provide a set of output bits as read data from a set of selected MRAM cells at a read address of the data array and configured to provide a sensor output indicative of a rupture state of an MTJ of a selected sensor cell of the sensor array; and
    a life predictor circuit configured to provide a warning indicating of impending failure of the data array based on the sensor output.

2. The MRAM of claim 1, wherein the rupture state of the MTJ of the selected sensor cell is selected from a group consisting of a permanently ruptured state and a non-ruptured state.

3. The MRAM of claim 1, wherein the read circuitry comprises:
    a first set of sense amplifiers configured to be coupled to columns of the data array and sense the set of output bits of the selected MRAM cells of the data array during a read operation on the data array, and
    a second set of sense amplifiers configured to be coupled to the sensor column and sense the rupture state of the MTJ of the selected sensor cell during a read operation on the sensor array.

4. The MRAM of claim 1, further comprising:
    write circuitry configured to, with each write operation to a set of selected MRAM cells at a corresponding write address in the data array along a corresponding selected word line, provide a write current through each MTJ of the set of selected MRAM cells and provide an increased write current through an MTJ of a selected sensor cell along the corresponding selected word line.

5. The MRAM of claim 4, wherein, with each write operation, the increased write current is provided by both the first and the second select transistors of the first and second MRAM cells of the selected sensor cell along the corresponding selected word line.

6. The MRAM of claim 5, each write operation includes a first write phase to write a first logic state to a subset of the set of selected MRAM cells at the corresponding write address in the data array and a second phase to write a second logic state to a remaining subset of the set of selected MRAM cells at the corresponding write address in the data array, wherein the increased write current is provided through the MTJ of the selected sensor cell along the corresponding selected word line is provided during both the first write phase and the second write phase.

7. The MRAM of claim 6, wherein the write current and the increased write current are provided in a first direction through the MTJs of the subset of the set of selected MRAM cells and the MTJ of the selected sensor along the corresponding selected word line during the first write phase, and are provided in a second direction, opposite the first direction, through the MTJs of the remaining subset of the set of selected MRAM cells and the MTJ of the selected sensor along the corresponding selected word line during the second phase.

8. The MRAM of claim 1, wherein the corresponding bit line of the first column is connected to the corresponding bit line of the second column to form a first sensor bit line and the corresponding source column of the first column is connected to the corresponding source line of the second column to form a first sensor source line.

9. The MRAM of claim 8, wherein in each sensor cell:
a source electrode of the first select transistor in the first MRAM cell is connected to a first source line corresponding to the first column, and a source electrode of the second select transistor in the second MRAM cell is connected to a second source line corresponding to the second column,
a gate electrode of the first select transistor in the first MRAM cell and a gate electrode of the second select transistor in the second MRAM cell are connected to the same word line, and
the only one of the first MTJ or the second MTJ is connected to the drain electrodes of the first and second select transistors and to a first bit line corresponding to the first column, and a second MTJ of the second MRAM cell is connected to the drain electrodes of the first and second select transistors but is not connected to a second bit line corresponding to the second column.

10. A magnetoresistive random access memory (MRAM) comprising:
an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
each MRAM cell of the data array is configured to store a data bit, and
in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other;
read circuitry configured to provide a set of output bits as read data from a set of selected MRAM cells at a read address of the data array and configured to provide a sensor output indicative of a rupture state of an MTJ of a selected sensor cell of the sensor array; and
a life predictor circuit configured to provide a warning indicating of impending failure of the data array based on the sensor output,
wherein the rupture state of the MTJ of the selected sensor cell is selected from a group consisting of a permanently ruptured state and a non-ruptured state,
wherein when the MTJ of the selected sensor cell is in the non-ruptured state, the sensor output has a first logic state and the MTJ of the selected sensor cell is capable of having a resistance state selected from a group consisting of a high resistance state (HRS) and a low resistance state (LRS), and when the MTJ of the selected sensor cell is in the permanently ruptured state, the sensor output has a second logic state and the MTJ of the selected sensor cell has a very low resistance that is lower than a resistance of each of the HRS and the LRS.

11. A magnetoresistive random access memory (MRAM) comprising:
an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
each MRAM cell of the data array is configured to store a data bit, and
in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other;
read circuitry configured to provide a set of output bits as read data from a set of selected MRAM cells at a read address of the data array and configured to provide a sensor output indicative of a rupture state of an MTJ of a selected sensor cell of the sensor array; and
a life predictor circuit configured to provide a warning indicating of impending failure of the data array based on the sensor output,
wherein the read circuitry comprises:
a first set of sense amplifiers configured to be coupled to columns of the data array and sense the set of output bits of the selected MRAM cells of the data array during a read operation on the data array, and
a second set of sense amplifiers configured to be coupled to the sensor column and sense the rupture state of the MTJ of the selected sensor cell during a read operation on the sensor array,
wherein the first set of sense amplifiers is configured to use a first reference which differentiates between a logic state of zero and a logic state of one, and the second set of sense amplifiers is configured to use a second reference, different from the first reference, which differentiates between a permanently ruptured state and a non-ruptured state.

12. The MRAM of claim 11, wherein:
the logic state of zero corresponds to a first resistance state,
the logic state of one corresponds to a second resistance state, different from the first resistance state,
the permanently ruptured state corresponds to a third resistance state that is lower in resistance than each of the first resistance state and the second resistance state, and
the first reference corresponds to a resistance between the first and second resistance states, and the second reference corresponds to a resistance between the third resistance and a lowest resistance of the first and second resistance states.

13. A magnetoresistive random access memory (MRAM) comprising:
an MRAM array including a data array and a sensor array, the MRAM array arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
each MRAM cell of the data array is configured to store a data bit, and
in the sensor array, a first column is connected to a second column to form a sensor column, the sensor column including sensor cells in which each sensor cell is formed by a first MRAM cell in the first column together with a second MRAM cell in the second column along a same word line, wherein only one of a first MTJ of the first MRAM cell or a second MTJ of the second MRAM cell is used as an MTJ of the sensor cell, and drain electrodes of a first select transistor of the first MRAM cell and a second select transistor of the second MRAM cell are electrically connected to each other wherein the drain electrode of the first select transistor of the first MRAM cell is located between a gate of the first select transistor and the first MTJ and the drain electrode of the second select transistor of the second MRAM cell is located between a gate of the second select transistor and the second MTJ; and
write circuitry configured to, with each write operation to a set of selected MRAM cells at a corresponding write address in the data array along a corresponding selected word line, provide a write current through each MTJ of the set of selected MRAM cells at the corresponding write address and provide an increased write current through each MTJ of any sensor cell along the corresponding selected word line.

14. The MRAM of claim 13, wherein, for each write operation, the write current through each MTJ of the set of selected MRAM cells at the corresponding write address is provided by a single select transistor in one MRAM cell, and the increased write current through each MTJ of any corresponding sensor cell is provided by multiple select transistors connected in parallel from multiple MRAM cells.

15. The MRAM of claim 13, further comprising read circuitry which includes:
a first set of sense amplifiers configured to be coupled to columns of the data array and sense a set of output bits from a set of selected MRAM cells at a read address of the data array using a first reference during a read operation on the data array, and
a second set of sense amplifiers configured to be coupled to the sensor column and sense a rupture state of an MTJ of a selected sensor cell using a second reference, different from the first reference, during a read operation on the sensor array.

16. The MRAM of claim 15, wherein the first reference differentiates between a logic state of zero and a logic state of one stored in any selected MRAM cell of the data array, and the second reference differentiates between a permanently ruptured state and a non-ruptured state of any selected sensor cell of the sensor array.

17. In an MRAM having a data array and a sensor array in which the MRAM array arranged in rows and columns, each row having a corresponding word line and each column having a corresponding bit line and a corresponding source line, and an intersection of each row and column has a corresponding MRAM cell, wherein each corresponding MRAM cell includes a select transistor and a Magnetic Tunnel Junction (MTJ), a method comprising:
in response to a write request having a corresponding write address and write data, wherein the write address addresses a set of selected MRAM cells in the data array, performing a write operation to write the write data to the set of selected MRAM cells in the data array; and
in response to the write request, providing a write current through an MTJ of any sensor cell in the sensor array along a same row as the set of selected MRAM cells, wherein each sensor sell includes multiple MRAM array cells along the same row with drain-connected select transistors in which only one MTJ of the multiple MRAM array cells operates as an MTJ of the sensor cell.

18. The method of claim 17, wherein performing the write operation comprises:
providing a first write current in a first direction to write a first logic state to a subset of the set of selected MRAM cells in the data array and simultaneously providing an increased first write current in the first direction through the MTJ of the any sensor cell in the sensor array along the same row, and
providing a second write current in a second direction, opposite the first direction, to write a second logic state to a remaining subset of the set of selected MRAM cells at in the data array and simultaneously providing an increased second write current in the second direction through the MTJ of the any sensor cell in the sensor array along the same row.

19. The method of claim 18, wherein each of the increased first and second write currents are provided by drain-connected select transistors in parallel of multiple MRAM array cells along the same row.

20. The method of claim 17, further comprising:
in response to a read request having a corresponding read address which addresses a set of selected MRAM cells at the read address in the data array, performing a read operation to obtain read data from the set of selected MRAM cells at the read address, using a first reference to differentiate between a first logic state and a second logic state of each bit of the read data, and
providing a sensor output indicative of a rupture state of a selected sensor cell of the sensor array in response to sensing the selected sensor cell using a second reference, different from the first reference, to differentiate between a permanently ruptured state and a non-ruptured state of an MTJ of the selected sensor cell.

* * * * *